(12) United States Patent
Martinez et al.

(10) Patent No.: US 8,328,961 B2
(45) Date of Patent: Dec. 11, 2012

(54) IRON-NICKEL ALLOY STRIP FOR THE MANUFACTURE OF SUPPORT GRIDS FOR THE INTEGRATED CIRCUITS

(75) Inventors: Georges Martinez, Montigny Aux Amognes (FR); Pierre-Louis Reydet, Montigny Aux Amognes (FR); Gilles Bresson, Sorbiers (FR); Gilles Coccoz, Nevers (FR); Jean-Luc Spire, Le Perreus sur Marne (FR); Jerome Giusti, Nevers (FR)

(73) Assignee: Imphy Alloys, Saint Denis (FR)

( * ) Notice: Subject to any disclaimer, the term of this patent is extended or adjusted under 35 U.S.C. 154(b) by 299 days.

(21) Appl. No.: 11/718,649

(22) PCT Filed: Nov. 4, 2005

(86) PCT No.: PCT/FR2005/002741
§ 371 (c)(1),
(2), (4) Date: Jul. 30, 2007

(87) PCT Pub. No.: WO2006/051188
PCT Pub. Date: May 18, 2006

(65) Prior Publication Data
US 2009/0120542 A1   May 14, 2009

(30) Foreign Application Priority Data
Nov. 5, 2004 (FR) ..................... 04 11854

(51) Int. Cl.
*C21D 8/02* (2006.01)
*C21D 8/00* (2006.01)
*C22C 30/00* (2006.01)
*C22C 38/08* (2006.01)
*C22C 38/40* (2006.01)

(52) U.S. Cl. .......... 148/336; 148/332; 148/620; 420/94; 420/97

(58) Field of Classification Search ........... 148/620, 148/336, 332, 442, 707; 420/94, 97; C21D 8/00, C21D 8/02, 9/46; C22C 38/08, 38/40
See application file for complete search history.

(56) References Cited

U.S. PATENT DOCUMENTS

| | | | |
|---|---|---|---|
| 5,532,088 A | 7/1996 | Teshima et al. | |
| 5,637,161 A | 6/1997 | Inoue et al. | |
| 5,792,286 A * | 8/1998 | Inoue et al. | 148/336 |
| 6,547,893 B1 * | 4/2003 | Itoh et al. | 148/336 |
| 6,605,163 B2 * | 8/2003 | Cozar et al. | 148/336 |
| 6,692,992 B1 * | 2/2004 | Cozar et al. | 438/123 |

FOREIGN PATENT DOCUMENTS

| | | | |
|---|---|---|---|
| JP | 2 170922 | | 7/1990 |
| JP | 02170922 A | * | 7/1990 |
| JP | 6 73452 | | 3/1994 |
| JP | 6 271936 | | 9/1994 |
| JP | 08-316390 | | 11/1996 |
| JP | 10 204541 | | 8/1998 |
| JP | 2003-253338 | | 9/2003 |
| WO | 01 92587 | | 12/2001 |

OTHER PUBLICATIONS

Buschow et al., Encyclopedia of Materials—Science and Technology (Recrystallization, 2001, Elsevier vol. 1-11, p. 5421).*
Ullman's Encyclopedia of Industrial Chemistry (Steel, 2008 by Wiley-VCH Verlag GmbH & Co).*

* cited by examiner

*Primary Examiner* — Jessica L Ward
*Assistant Examiner* — Alexander Polyansky
(74) *Attorney, Agent, or Firm* — Oblon, Spivak, McClelland, Maier & Neustadt, L.L.P.

(57) ABSTRACT

The invention concerns an iron-nickel alloy strip comprising the following expressed in wt. %: $32 \leq Co+Ni \leq 45\%$, $0 \leq Co \leq 6.5\%$, $0 \leq Cr = 6.5\%$, $Cu \leq 3\%$, $Si \leq 0.5\%$, $Mn \leq 0.75\%$, the rest being made up of iron and unavoidable impurities resulting from production, whereof the microstructure has a recrystallized volume fraction ranging from 3 to 97%, whereof the thickness is less than 0.5 mm. The invention also concerns the use thereof in the manufacture of support grids for integrated circuits.

14 Claims, 1 Drawing Sheet

IRON-NICKEL ALLOY STRIP FOR THE MANUFACTURE OF SUPPORT GRIDS FOR THE INTEGRATED CIRCUITS

BACKGROUND OF THE INVENTION

The present invention relates to iron-nickel alloy strips that can be used in particular for the manufacture of support grids for integrated circuits in a broad range of electronic components such as static memories, dynamic or programmable memories, and microprocessors.

Electronic components contain integrated circuits manufactured from silicon dice engraved and glued onto grids intended in particular to form connection pads of these integrated circuits. These grids must be made of an alloy having multiple properties that make them compatible with the silicon dice known as "electronic chips" and permitting the manufacture of components under good conditions. In particular, the alloy must have a coefficient of thermal expansion slightly greater than that of silicon, in order to maintain the component in compression during the cooling phases of the thermal cycles of the method for manufacture of the component and during use of same, in order to avoid the development of large mechanical stresses.

In addition, the alloy must have sufficiently high tensile strength Rm that the connection pads do not become deformed during manipulations by means of robots. However, it must also have good shapability, that is, on the one hand sufficient ductility characterized by total elongation greater than 5% and on the other hand a ratio between the yield strength $R_{p0.2\%}$ and Young's modulus E that is sufficiently low to reduce elastic recovery during bending of the pads. All of these characteristics make it possible to avoid any damage to the pads while they are being shaped.

Finally, the obtained strip as well as the manufactured pads must have the greatest possible dimensional stability after cutting, but also throughout the different thermal cycles of the manufacturing method and during use of the strip.

This dimensional stability is manifested by small residual stresses in the strip, to ensure coplanarity of the internal and external pads of the grids, but also by small contraction during the heat treatments used for manufacture of components. It is therefore estimated that the contraction value of a strip having a length of 180 mm and subjected to a heating cycle at 500° C. for 4 minutes must never exceed 15 μm, that is, to a deformation λr smaller than $8.10^{-3}$%, and preferably smaller than $4.10^{-3}$% for the most exacting components.

Traditionally, the support grids of integrated circuits are made of N42® alloy, which is an iron-nickel alloy containing approximately 41% of nickel. The strips used are obtained by a standard manufacturing method comprising a series of cold-rolling operations with intermediate recrystallization annealing phases, the last operation being a cold-rolling in which the degree of cold work (or percentage thickness reduction) makes it possible to adjust the mechanical characteristics and especially the Rm of the future grid. However, the obtained strips have inadequate characteristics in terms of bendability but also of dimensional stability, and more particularly in terms of contraction. In fact, contractions as severe as $40.10^{-3}$% and not going below $6.10^{-3}$% are commonly observed.

In order to remedy these disadvantages, it is common practice to use strips that have been subjected to a supplementary final heat treatment known as stress relief annealing, at a temperature very much lower than the recrystallization temperature, in order to reduce the residual stresses and the contraction without significantly lowering the tensile strength. However, this treatment is not capable of reducing the contraction below $5.10^{-3}$% or of reducing the totality of the residual stresses, thus resulting in dimensional stability problems that can be observed in grids dedicated to the most exacting applications.

BRIEF SUMMARY OF THE INVENTION

The object of the invention is therefore to provide an iron-nickel alloy strip that is better suited to the manufacture of support grids of integrated circuits and that in particular has improved dimensional stability characteristics and bendability compared with the prior art solutions.

To this end, a first object of the invention is an iron-nickel alloy strip that comprises, in % by weight:

$32 \leq Co+Ni \leq 45\%$
$0 \leq Co \leq 6.5\%$
$0 \leq Cr \leq 6.5\%$
$Cu \leq 3\%$
$Si \leq 0.5\%$
$Mn \leq 0.75\%$ the rest being iron and the inevitable impurities resulting from smelting, wherein the microstructure exhibits a recrystallized volume fraction of between 3 and 97% and the thickness is smaller than 0.5 mm.

The inventors have in fact observed that such a microstructure surprisingly made it possible to solve all of the different technical problems posed.

The alloy strip according to the invention may also have any one of the following characteristics, taken individually or in combination:

- the said microstructure comprises grains in the course of recrystallization, having a maximum diameter of 20 μm, visible under the transmission electron microscope (TEM) in a thin section,
- the strip has a tensile strength Rm between 540 and 755 MPa,
- the strip has a tensile strength Rm between 540 and 600 MPa and a recrystallized volume fraction between 3 and 97%, preferably between 45 and 95%,
- the strip has a tensile strength Rm between 620 and 755 MPa and a recrystallized volume fraction between 3 and 70%, preferably between 40 and 70%,
- the strip has contraction smaller than or equal to $4.10^{-3}$%, and preferably smaller than or equal to $3.10^{-3}$%, after a test at 500° C. for 4 minutes.

A second object of the invention is a method for manufacture of an iron-nickel alloy strip according to the invention, wherein there are performed the following successive operations:

there is procured an ingot, a billet or a slab of iron-nickel alloy that comprises, in % by weight:

$32 \leq Co+Ni \leq 45\%$
$0 \leq Co \leq 6.5\%$
$0 \leq Cr \leq 6.5\%$
$Cu \leq 3\%$
$Si \leq 0.5\%$
$Mn \leq 0.75\%$ the rest being iron and the inevitable impurities resulting from smelting, this is hot-worked to obtain a strip, then the cooled strip is subjected to a first cold-rolling operation, then if necessary the cold-rolled strip is subjected to an annealing heat treatment in order to obtain a fully recrystallized strip, then to a second cold-rolling operation, and these two operations are repeated if necessary until the target thickness is attained, then the obtained strip is subjected to a final partial recrystallization treatment in order to obtain a strip whose recrystallized volume fraction is between 3 and 97%.

BRIEF DESCRIPTION OF THE INVENTION

The iron-nickel alloy that constitutes the strip according to the invention comprises 32 to 45% by weight of nickel, preferably 38 to 43% of nickel and more particularly preferably 40 to 42% of nickel in combination with a combined total content of Cu, Co and Cr of less than 1%.

The nickel may be replaced partly by cobalt in a proportion of 6.5% at most and preferably of 4.5%, and the minimal content of cobalt may be 0%.

The composition may contain up to 3% of copper (the minimal content being 0% or traces), in order to improve the resistance to corrosion and to atmospheric oxidation; however, it must not exceed this content, to avoid degrading the coefficient of thermal expansion.

The chromium content of the composition may be increased to 6.5% by weight by adjusting the nickel content, but it must not exceed this content, to avoid degrading the coefficient of thermal expansion, and preferably it must not exceed 5.5% by weight. The addition of this element makes it possible in particular to improve the corrosion resistance of the alloy and its oxidation resistance during the phases of tinning and brazing of the grid pads.

The contents of nickel, cobalt, copper and chromium are chosen in order to ensure that the coefficient of thermal expansion between 20° C. and any temperature between 20 and 300° C. will be between $3.5 \cdot 10^{-6}$ and $6.5 \cdot 10^{-6}$/K.

The composition also comprises up to 0.5% of silicon and up to 0.75% of manganese, which may be introduced if necessary during smelting in order to ensure killing of the alloy, the minimal contents of these elements being traces.

The rest of the composition consists of iron and inevitable impurities resulting from smelting.

The alloy according to the invention may be smelted in the electrical arc furnace with a fining phase followed by a metallurgical step in a heating ladle, for example. It may also be smelted in the vacuum induction furnace or by any other suitable method.

The alloy is then cast in the form of a semifinished product such as an ingot, a billet, a slab or a remelting electrode. When the alloy is cast in the form of a remelting electrode, it is remelted either under vacuum or under electroslag, in order to obtain greater purity and more homogeneous semifinished products.

Depending on its cross section, the semifinished product is hot-worked in one or two operations at a temperature above 950° C. and preferably above 1050° C. but preferably below 1300° C., to obtain a hot strip whose thickness is generally between 2 and 6 mm and preferably between 2.5 and 5 mm. The hot-working operations may include blooming and/or hot-rolling, and they may be accompanied if necessary by homogenizing heat treatments between 950° C. and 1300° C., which treatments may last from a few minutes to several hours. At the end of hot-working, the obtained strip is cooled to a temperature close to room temperature.

An equivalent strip may be obtained directly by continuous casting of thin strip, the method then including hot-rolling in line if necessary.

The cooled strip is then subjected to a first cold-rolling operation to obtain a strip whose thickness is between 1 and 2 mm, for example. This operation may be performed in one or more successive passes.

After this cold-rolling operation, the strip may then be subjected to a heat treatment consisting in full recrystallization annealing. This treatment may be performed in a static furnace for a duration lasting from 10 minutes to several hours at a temperature above 700° C. or else in a continuous annealing furnace for a duration lasting from a few seconds to approximately 1 minute, at a temperature preferably above 800° C. in the holding zone of the furnace, preferably under an inert or reducing atmosphere. At the end of this heat treatment, the duration of which has been adapted to the treatment temperature, the strip is fully recrystallized, thus making it possible to obtain an alloy that is again ductile, for the purpose of subsequent cold-working.

It will also be possible to manufacture the strip according to the invention by performing only one cold-rolling operation, followed by the final heat treatment of partial recrystallization, without proceeding with full recrystallization annealing as just described.

If full recrystallization annealing is performed, it is followed by a second cold-rolling operation in order to obtain a strip having a final thickness of between 0.05 and 0.5 mm, for example. This operation can be performed in one or more successive passes.

At the end of this second operation, either one or more composite cycles of cold-rolling followed by full recrystallization annealing may be repeated, or the strip may be subjected directly to a final partial recrystallization annealing heat treatment, depending on the final thickness desired for the alloy strip.

The partial recrystallization heat treatment is preferably performed by passage through a continuous furnace, preferably under inert or reducing atmosphere, at a temperature T between 650 and 825° C., for a duration shorter than 120 seconds, and preferably at a temperature above 660° C. for a duration shorter than 60 seconds. More particularly preferably, the temperature of the heat treatment is higher than 695° C. for a duration shorter than 20 seconds, and even better, the temperature is higher than 710° C. for a duration shorter than 10 seconds. In general, the duration t in seconds and the heat treatment temperature T in ° C. according to the invention are related by the following equation:

$$T=775-27\ln(t)$$

with a precision of ±15° C.

By way of comparison, a stress-relief heat treatment according to the prior art obeys the following equation:

$$T=700-27\ln(t)$$

with a precision of ±15° C.

BRIEF DESCRIPTION OF THE DRAWINGS

The microstructure obtained according to the invention is mixed, and in particular it includes restored grains and partly recrystallized grains.

This is more particularly illustrated by the attached figures, wherein.

The recrystallized volume fraction Fvr can be determined in particular by means of the following equation:

$$Fvr = 100 \cdot \frac{R_m^0 - R_m}{R_m^0 - 525}$$

where:

$R_m^0$: tensile strength of the strip in the cold-worked condition,
$R_m$: tensile strength of the strip after partial recrystallization treatment.

Figure 1:
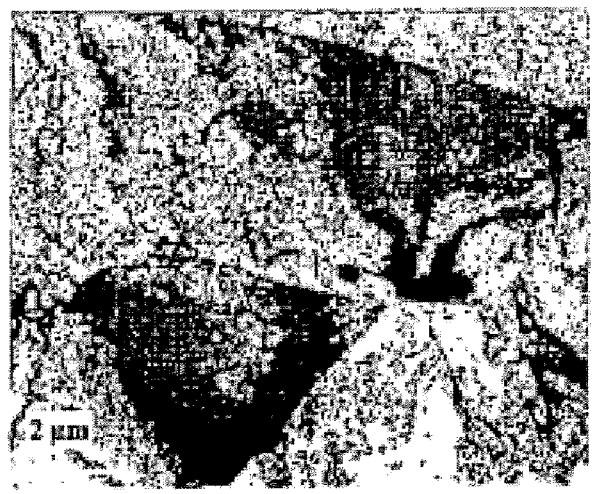
FIG. 1 represents a microstructure of a cold-worked alloy strip according to the prior art, observed by TEM on a thin section.

In the case of the strip of FIG. 1, since the strip has not been subjected to the final partial recrystallization treatment, its $R_m$ is equal to $R_m^0$, and the recrystallized volume fraction is therefore zero.

Figure 2:
FIG. 2 represents a microstructure of an alloy strip according to the invention, observed by TEM on a thin section.

The microstructure illustrated in FIG. 2 corresponds to a strip according to an embodiment of the invention, obtained by the method according to the invention ending with a final partial recrystallization heat treatment. There is observed the presence of restored grains (cell structures) surrounded by partly recrystallized grains (dislocation-free structure).

This embodiment corresponds to the commercial grade known as "quarter hard", which has a tensile strength Rm between 540 MPa and 600 MPa. Its recrystallized volume fraction is equal to 85% and corresponds to an Rm after heat treatment of 565 MPa and to an $R_m^0$ before heat treatment of 795 MPa, to within ±10 MPa.

There also exists another commercial grade known as "half hard", which has a tensile strength Rm between 620 MPa and 755 MPa and that can be obtained according to the present invention, especially by adjusting the recrystallized volume fraction within a bracket from 3 to 70%. Its typical recrystallized volume fraction is equal to 50% and corresponds to an Rm after heat treatment of 660 MPa and to an $R_m^0$ before heat treatment of 795 MPa, to within ±10 MPa.

Figure 3:
FIG. 3 represents a microstructure of a fully recrystallized alloy strip according to the prior art, observed by TEM on a thin section, Considering FIG. 1, there can be seen therein the microstructure of a cold-worked strip, obtained by a traditional method that ends with an annealing heat treatment and a final cold-rolling step with 25% cold-working. There is observed the presence of a high density of dislocations. The recrystallized volume fraction of this strip is equal to 0%.

The microstructure presented in FIG. 3 corresponds to an alloy strip according to the prior art, obtained by a traditional method ending with a final full recrystallization heat treatment. Its recrystallized volume fraction is therefore equal to 100%.

It will be noted that the microstructure of a strip that has been subjected to stress-relief heat treatment is not distinguished from that of the cold-worked condition of FIG. 1, since its recrystallized volume fraction is very close to 0% and in all cases much lower than 3%.

DETAILED DESCRIPTION OF THE INVENTION

EXAMPLE 1

Dimensional Stability 1.1 Contraction Test

A series of specimens having a thickness of 0.1 mm was manufactured from the same alloy composition comprising 41% nickel, 0.05% cobalt, 0.15% silicon, 0.50% manganese and 0.05% copper, the rest being iron.

A first series of specimens, designated as lot A, was manufactured according to the traditional prior art method achieved by cold-rolling with a degree of cold work ranging from 10 to 25%.

A second series of specimens, designated as lot A', was manufactured according to the traditional prior art method achieved by stress-relief annealing heat treatment at a temperature of 650° C. for a duration of 6 seconds.

A third series of specimens, designated as lot B, was manufactured according to the invention, by using a final partial recrystallization heat treatment performed by passage through a continuous furnace at temperatures between 700° C. and 780° C. for less than 10 seconds.

The contraction test is performed on pieces measuring 30×200 mm. It consists of three phases.

(a) implementation of two microhardness indentations approximately 180 mm apart, and measurement of the distance $L_0$ between the two indentations to within ±2 µm by means of an optical microscope equipped with a motorized platen (positioning precision in x, y and z ~0.1 µm), (b) heat treatment of the piece for 4 minutes at 500° C. under argon, (c) measurement of the distance $L_1$ between the two indentations after treatment, and calculation of the contraction:

$$\lambda r = (L_0 - L_1)/L_0$$

The measurement results are presented in the following table:

TABLE 1

| Lot | Last step before measurement of contraction | λr |
|---|---|---|
| A1 | 10% cold work | $7 \cdot 10^{-3}$% |
| A2 | 25% cold work | $17 \cdot 10^{-3}$% |
| A'1 | 10% cold work + stress relief | $5 \cdot 10^{-3}$% |
| A'2 | 25% cold work + stress relief | $6 \cdot 10^{-3}$% |
| B1 | 3 seconds of partial recrystallization at 750° C. | $<2 \cdot 10^{-3}$% |
| B2 | 5 seconds of partial recrystallization at 730° C. | $<2 \cdot 10^{-3}$% |

It is clearly evident that the strips according to the invention have a contraction level—at the limit of detection by this measurement method—that is much smaller than the values obtained according to the prior art.

1.2 Test of Bowing after Chemical Etching on One Face

The evolution of bowing that a thin strip exhibits as a function of reduction of its thickness by etching on one face by a chemical or other method is a customary method for characterizing the level of residual stresses present in the thickness of thin products.

This technique was applied by single-face chemical etching in a solution of iron perchlorate (41.5 degrees Baumé solution at 48° C.—pH=0.8), at room temperature. The observed bowing was determined by measuring the deflection over a 50 mm chord length by laser telemetry in the rolling direction on pieces 10 mm wide.

The results are presented in Table 2:

TABLE 2

| Specimen | % chemical etching | Deflection over 50 mm chord length (mm) |
|---|---|---|
| A | 50% | 5 to 10 |
| A' | 50% | 2 to 6 |
| B | 50% | <0.5 |

It can be considered that the specimens of lot B do not exhibit any bowing, in contrast to the specimens of lot A and of lot A'. Similar results were observed for measurement of bowing in the transverse direction.

The dimensional stability of the specimens according to the invention is therefore excellent.

EXAMPLE 2

Bendability 2.1 Ratio $R_{p0.2\%}/E$

The three specimen lots A, A' and B as defined in Example 1 are again used; their yield strength $R_{p0.2\%}$, their Young's modulus E and their tensile strength is measured and the recrystallized volume fraction is determined.

The results obtained are presented in Table 3:

TABLE 3

| Specimen | Grade | Rm (MPa) | Fvr (%) | $R_{p0.2\%}/E$ |
|---|---|---|---|---|
| A1 | quarter hard | 563 | 0 | $41 \cdot 10^{-2}$ |
| A2 | half hard | 665 | 0 | $47 \cdot 10^{-2}$ |
| A'1 | quarter hard | 552 | 0 | $35 \cdot 10^{-2}$ |
| A'2 | half hard | 654 | 0 | $43 \cdot 10^{-2}$ |
| B1 | quarter hard | 566 | 85 | $28 \cdot 10^{-2}$ |
| B2 | half hard | 663 | 49 | $38 \cdot 10^{-2}$ |

It can be seen that lot B according to the invention has a ratio $R_{p0.2\%}/E$ that is 20 to 30% smaller than that of lot A and 10 to 20% smaller than that of lot A', thus indicating greatly improved bendability.

2.2 Total Elongation At %

The measurements of total elongation due to plane tension are performed on specimens of lots A, A' and B such as defined in Example 1.

TABLE 4

| Specimen | Grade | Rm (MPa) | Fvr (%) | At (%) |
|---|---|---|---|---|
| A1 | quarter | 563 | 0 | 14 |
| A2 | half hard | 665 | 0 | 5 |
| A'1 | quarter hard | 552 | 0 | 19 |
| A'2 | half hard | 654 | 0 | 10 |
| B1 | quarter hard | 566 | 85 | 25 |
| B2 | half hard | 663 | 49 | 15 |

It is evident that, for a desired value of Rm, the specimens according to the invention exhibit total elongation that is greater than the elongation of specimens according to the prior art.

The invention claimed is:

1. An iron-nickel alloy strip that comprises, in % by weight:
   $32 \leq Co+Ni \leq 45\%$,
   $0 \leq Co \leq 6.5\%$,
   $0 \leq Cr \leq 6.5\%$,
   $Cu \leq 3\%$,
   $Si \leq 0.5\%$,
   $Mn \leq 0.75\%$,
   $40 \leq Ni \leq 45\%$,
   iron and the inevitable impurities resulting from smelting, wherein the strip has a recrystallized volume fraction of from 3 to 97% and a thickness of the strip is smaller than 0.5 mm, wherein the strip is obtained by a process comprising:
   subjecting the strip to a cold-rolling operation to obtain a cold-rolled strip with a target thickness, then,
   optionally, if the target thickness is not obtained, subjecting the cold-rolled strip to an annealing heat treatment in order to obtain a fully recrystallized strip, then to an additional cold-rolling operation to cold-roll the fully recrystallized strip, wherein the annealing and the additional cold rolling are optionally repeated until the target thickness is obtained, and
   subjecting the obtained strip with the target thickness to a final partial recrystallization treatment in order to obtain a strip having the recrystallized volume fraction of from 3 to 97%,
   wherein: the final partial recrystallization heat treatment is carried out at a temperature of from 650 to 825° C. where a duration time is shorter than 10 seconds when the temperature is higher than 710° C.; and no further cold-rolling is applied to the strip after the final partial recrystallization heat treatment.

2. The strip according to claim 1, wherein the said strip comprises not fully recrystallized grains, having a maximum diameter of 20 μm, visible under the transmission electron microscope in a thin section.

3. The strip according to claim 1, wherein the strip has a tensile strength Rm between 540 and 755 MPa.

4. The strip according to claim 3, wherein the strip has a tensile strength Rm between 540 and 600 MPa and a recrystallized volume fraction between 3 and 97%.

5. The strip according to claim 3, wherein the strip has a tensile strength Rm between 620 and 755 MPa and a recrystallized volume fraction between 3 and 70%.

6. The strip according to claim 1, wherein the strip has contraction smaller than or equal to $4.10^{-3}\%$ after a test at 500° C. for 4 minutes.

7. A method for manufacturing an iron-nickel alloy strip according to claim 1, comprising:
   procuring an ingot, a billet or a slab of an iron-nickel alloy that comprises, in % by weight:
   $32 \leq Co+Ni \leq 45\%$
   $0 \leq Co \leq 6.5\%$
   $0 \leq Cr \leq 6.5\%$
   $Cu \leq 3\%$
   $Si \leq 0.5\%$
   $Mn \leq 0.75\%$
   iron and the inevitable impurities resulting from smelting, hot-working the ingot, the billet or the slab to obtain a strip, cooling the strip to obtain a cooled strip, then
   subjecting the cooled strip to a cold-rolling operation to obtain a cold-rolled strip with a target thickness, then,
   optionally, if the target thickness is not obtained, subjecting the cold-rolled strip to an annealing heat treatment in order to obtain a fully recrystallized strip, then to an additional cold-rolling operation to cold-roll the fully recrystallized strip, wherein the annealing and the additional cold rolling are optionally repeated until the target thickness is obtained, then
   subjecting the obtained strip with the target thickness to a final partial recrystallization treatment in order to obtain a strip having a recrystallized volume fraction of from 3 to 97%,
   wherein: the final partial recrystallization heat treatment is carried out at a temperature of from 650 to 825° C. where a duration time is shorter than 10 seconds when the temperature is higher than 710° C.; and no further cold-rolling is applied to the strip after the final partial recrystallization heat treatment.

8. A method for manufacturing an iron-nickel alloy strip according to claim 1, comprising:
   procuring a thin strip of iron-nickel alloy that comprises, in % by weight:
   $32 \leq Co+Ni \leq 45\%$ $0 \leq Co \leq 6.5\%$
$0 \leq Cr \leq 6.5\%$
$Cu \leq 3\%$
$Si \leq 0.5\%$
$Mn \leq 0.75\%$ iron and the inevitable impurities resulting from smelting, optionally hot-rolling the strip, then subjecting the strip to a cold-rolling operation to obtain a cold-rolled strip with a target thickness, then, optionally, if the target thickness is not obtained, subjecting the cold-rolled strip to an annealing heat treatment in order to obtain a fully recrystallized strip, then to an additional cold-rolling operation to cold-roll the fully recrystallized strip, wherein the annealing and the additional cold rolling are optionally repeated until the target thickness is obtained, then subjecting the obtained strip with the target thickness to a final partial recrystallization treatment in order to obtain a strip having a recrystallized volume fraction of from 3 to 97%, wherein: the final partial recrystallization heat treatment is carried out at a temperature of from 650 to 825° C. where a duration time is shorter than 10 seconds when the temperature is higher than 710° C.; and no further cold-rolling is applied to the strip after the final partial recrystallization heat treatment.

9. An integrated circuit support grid obtained by cutting and shaping an iron-nickel alloy strip according to claim 1.

10. The strip according to claim 1, wherein the strip comprises $0 \leq Co \leq 4.5\%$.

11. The strip according to claim 1, comprising $42 \leq Ni \leq 45\%$.

12. The strip according to claim 1, wherein a coefficient of thermal expansion of the strip is between $3.5 \times 10^{-6}$ and $6.5 \times 10^{-6}$/K at a temperature between 20° C. and 300° C.

13. The strip according to claim 1, further comprising $0.05 \leq Co \leq 6.5\%$ by weight.

14. The strip according to claim 1, wherein the final partial recrystallization heat treatment is carried out under a condition that the temperature T in ° C. and the duration time t in seconds satisfy the following relationship:

$$T = 775 - 27 \ln(t)$$

with a precision of ±15° C.

* * * * *